United States Patent
Chen

(10) Patent No.: US 7,522,396 B2
(45) Date of Patent: Apr. 21, 2009

(54) ELECTROSTATIC DISCHARGE PROTECTION CIRCUIT

(75) Inventor: Chuen-Shiu Chen, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/849,367

(22) Filed: Sep. 4, 2007

(65) Prior Publication Data

US 2009/0057768 A1    Mar. 5, 2009

(51) Int. Cl.
H02H 3/20    (2006.01)
H02H 7/20    (2006.01)

(52) U.S. Cl. .................... 361/56; 361/111; 361/91.1
(58) Field of Classification Search ............. 361/56, 361/111, 91.1
See application file for complete search history.

(56) References Cited

U.S. PATENT DOCUMENTS 4,634,895 A * 1/1987 Luong .................... 327/62
6,940,317 B2 * 9/2005 Suga ...................... 327/65
7,009,826 B2   3/2006 Ker

* cited by examiner

Primary Examiner—Stephen W Jackson
Assistant Examiner—Zeev Kitov
(74) Attorney, Agent, or Firm—Winston Hsu

(57) ABSTRACT

Disclosed is an ESD protection circuit, which includes: an ESD protection element, coupled to a pad; a transmitting gate circuit; an N MOSFET, for providing a first biasing voltage to the transmitting gate circuit according to the second voltage level; a first P MOSFET, for providing a second biasing voltage to the transmitting gate circuit according to the first voltage level; a delay circuit for determining the turning on and turning off time of the transmitting gate circuit; a first inversing logic circuit, for generating a first control signal according to the output of the delay circuit; and a second inversing logic circuit, for generating a second control signal according to the output of the first inversing logic circuit, wherein the transmitting gate circuit turns on or turns off according to the first control signal and the second control signal.

10 Claims, 3 Drawing Sheets

ELECTROSTATIC DISCHARGE PROTECTION CIRCUIT

BACKGROUND OF THE INVENTION

1. Field of the Invention

The present invention relates to an ESD protection circuit, and particularly relates to an ESD protection circuit, which can isolate a pad and internal circuit to prevent formation of a parasitic NPN channel.

2. Description of the Prior Art

FIG. 1 illustrates a prior art ESD protection circuit 100. As shown in FIG. 1, the ESD protection circuit includes a first rectifying element 101, a second rectifying element 103, and a resistor 105. The first rectifying element 101 and the second rectifying element 103 can be a MOS (metal-oxide semiconductor) FET or a diode. The ESD protection circuit 100 is coupled to a pad 107 and an internal circuit 109 to prevent an ESD pulse being transmitted from the pad 107 to the internal circuit 109. Normally, the ESD pulse will be transmitted out via the first rectifying element 101 or the second rectifying element 103. If the resistor 105 is too small, however, a current transmitting through the resistor 105 will enter the internal circuit 109, thereby damaging it. The internal circuit can be easier to protect if the resistor 105 is larger, but this may cause circuit delay, which is a disadvantage for high-speed operation.

FIG. 2 illustrates a prior art ESD circuit 200, which is used to prevent a current entering the internal circuit 217. As shown in FIG. 2, the ESD protection circuit 200 comprises a transmitting gate circuit 201 and a control circuit 203, a first rectifying element 219 and a second rectifying element 221. The control circuit 203 is used for controlling the operation of the transmitting gate circuit 201. The transmitting gate circuit 201 is turned on (conductive) when in a normal operation mode, and the transmitting gate circuit 201 turns off to prevent the ESD pulse from entering an inner circuit. The size of the transmitting gate circuit 201 can be adjusted to adjust the input resistance of the pad 205. The capacitor 207 and the resistor 209 of the control circuit 203 constitute a delay circuit to determine the turning on and turning off time of the transmitting gate circuit 201. The N MOSFETs 211 and 213 are used for providing a biasing voltage to the P-Well or body of the N MOSFET 215 and the N-Well of the P MOSFET 214 respectively. The first rectifying element 219 and the second rectifying element 221 can be a MOS (metal-oxide semiconductor) FET or a diode.

However, since the P MOSFET 214 is directly coupled to the capacitor 207 and the resistor 209, the gate voltage of the P MOSFET 214 is generated via the ESD pulse coupling to the capacitor 207 when an ESD pulse enters, thus the P MOSFET 214 may not turn off completely. Besides, the N MOSFET 213 may have a parasitic NPN path due to improper layout, thus a destructive ESD pulse may transmit through the NPN path, damaging the parasitic NPN, if the ESD pulse transmits from pad 205 to the second voltage level $V_{GND}$. Therefore, the ESD protection circuit 200 may lose its function of protection.

U.S. Pat. No. 7,009,826 also discloses an oscillating circuit utilized as an ESD protection circuit. Such a circuit does not provide perfect isolation to an RF circuit and pad, however. Furthermore, the circuit co-utilizes an LC oscillating circuit, it may have an increased area, and may have unnecessary oscillation when in a normal operation. Other related operations of the circuit are disclosed in U.S. Pat. No. 7,009,826, and therefore omitted here for brevity.

Therefore, a new invention is needed to solve these problems.

SUMMARY OF THE INVENTION

One objective of the present invention is to provide an ESD protection circuit where the transmitting gate circuit is not directly coupled to the delay circuit to prevent the transmitting gate circuit from turning off incompletely when an ESD pulse enters.

Another objective of the present invention is to provide an ESD protection circuit, which utilizes a specific MOSFET to provide a biasing voltage to the transmitting gate circuit for avoiding a parasitic NPN path.

One embodiment of the present invention discloses an ESD protection circuit, which comprises: an ESD protection element, coupled to a pad; a transmitting gate circuit, coupled to the pad and the internal core circuit; a first N MOSFET, coupled to the transmitting gate circuit and a second voltage level, for providing a first biasing voltage to the transmitting gate circuit according to the second voltage level; a first P MOSFET, coupled to the transmitting gate circuit and a first voltage level, for providing a second biasing voltage to the transmitting gate circuit according to the first voltage level; a delay circuit, coupled to the ESD protection element, for determining the turning on and turning off time of the transmitting gate circuit; a first inversing logic circuit, coupled to the delay circuit, the transmitting gate circuit and the N MOSFET, for generating a first control signal according to the output of the delay circuit; and a second inversing logic circuit, coupled to the first inversing logic circuit, the P MOSFET and the transmitting gate circuit, for generating a second control signal according to the output of the first inversing logic circuit, wherein the transmitting gate circuit turns on or turns off according to the first control signal and the second control signal.

The transmitting gate circuit can comprise: a second N MOSFET, having a gate coupled to the gate of the first N MOSFET, wherein the first N MOSFET has a source coupled to the second voltage level and a drain coupled to the P-Well or body of the second N MOSFET; and a second P MOSFET, parallel to the second N MOSFET and having a gate coupled to the gate of the first P MOSFET, wherein the first P MOSFET has a source coupled to the first voltage level and a drain coupled to the N-Well of the second P MOSFET.

According to the above-mentioned circuit, the transmitting circuit can turn off to isolate the internal circuit and the pad when an ESD pulse happens. Also, an un-desired conductive path due to parasitic effect can be prevented.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
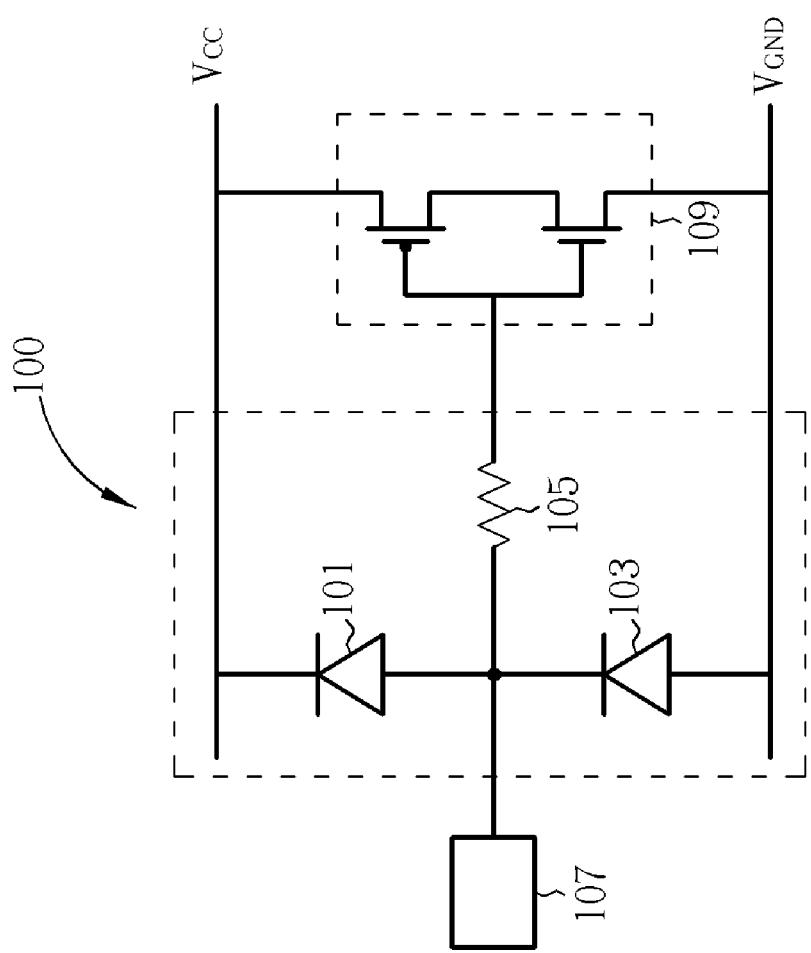
FIG. 1 illustrates a prior art ESD circuit.
Figure 2:
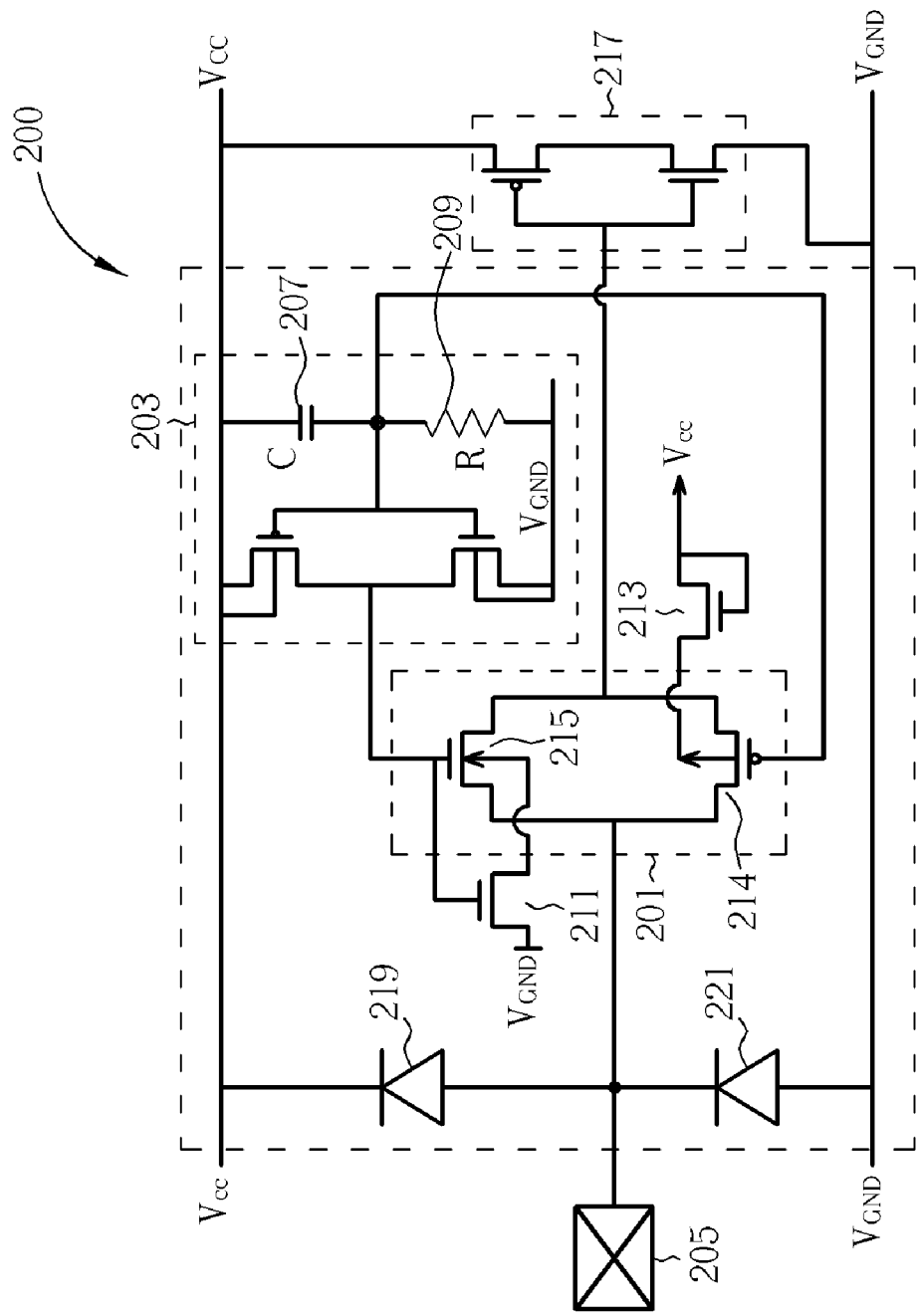
FIG. 2 illustrates a prior art ESD circuit.
Figure 3:
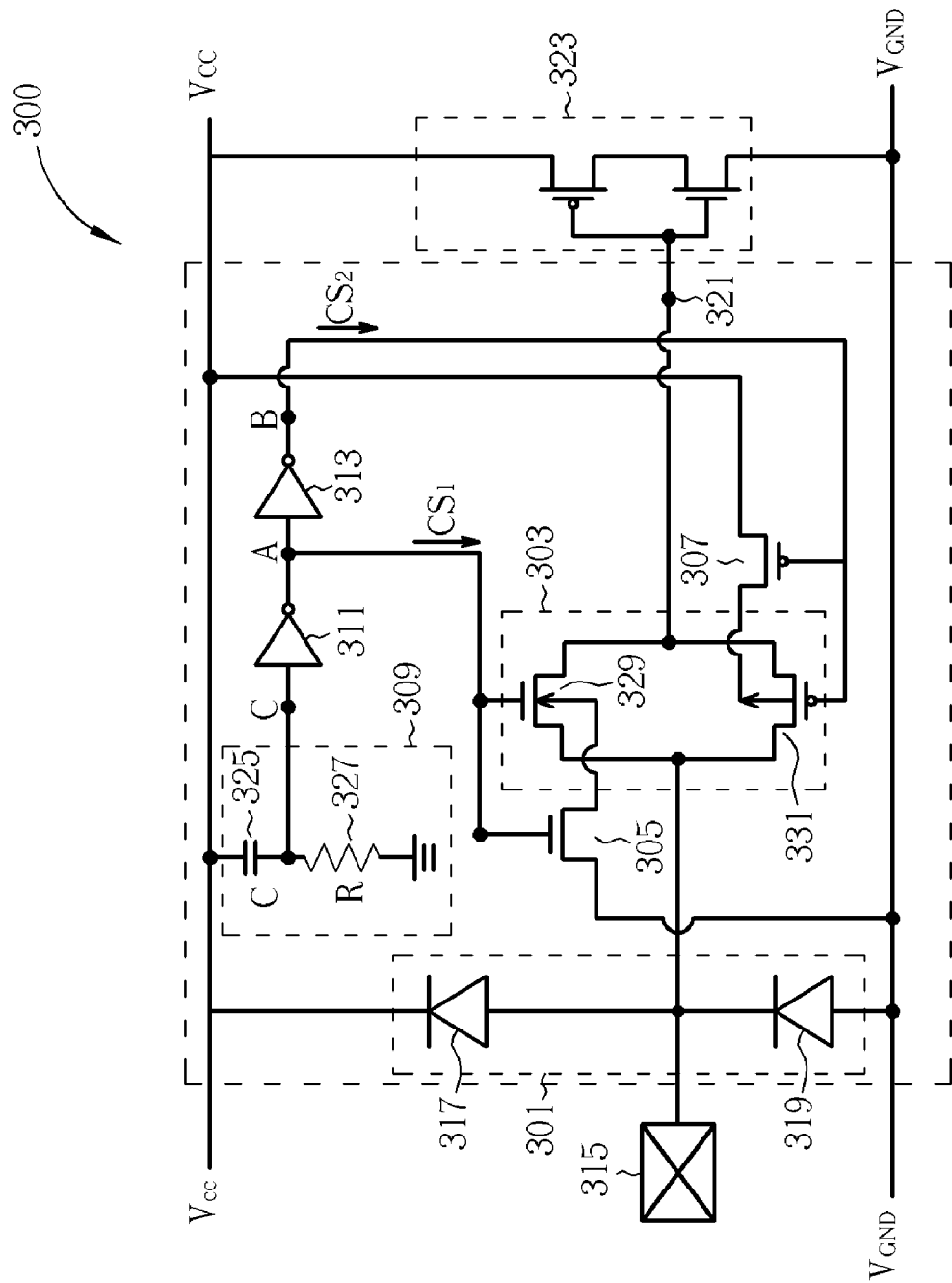
FIG. 3 illustrates an ESD circuit according to a preferred embodiment of the present invention.

FIG. 3 illustrates an ESD circuit 300 according to a preferred embodiment of the present invention. As shown in FIG. 3, the ESD circuit 300 includes an ESD protection element 301, a transmitting gate circuit 303, an N MOSFET 305, a P MOSFET 307, a delay circuit 309, a first inversing logic circuit 311 and a second inversing logic circuit 313. The ESD protection element 301 is coupled to a pad. In this embodiment, the ESD protection element 301 consists of rectifying elements 317 and 319, which can be diodes or MOSFETs. The transmitting gate circuit 303 is coupled to the pad 315 and an output terminal 321, which is coupled to (but not limited to be coupled to) an internal circuit 323 in this embodiment. The N MOSFET 305 (that is, a semiconductor unit), which is coupled to the transmitting gate circuit 303 and a second voltage level $V_{GND}$ (that is, a power line), is used for providing a first biasing voltage to the transmitting gate circuit 303 according to the second voltage level $V_{GND}$. It should be noted that the structures of the transmitting gate circuit 303 shown in FIG. 3 are merely given as examples and are not meant to limit the scope of the present invention.

The P MOSFET 307 (that is, another semiconductor element), which is coupled to the transmitting gate circuit 303 and a first voltage level $V_{cc}$, is used for providing a second biasing voltage to the transmitting gate circuit 303 according to the first voltage level $V_{cc}$ (another power line). The delay circuit 309, which is coupled to the ESD protection element 301, is used for determining the turning on and turning off time of the transmitting gate circuit 303. In this embodiment, the delay circuit 309 comprises a capacitor 325 and a resistor 327, but this is not meant to limit the scope of the present invention, wherein the value of the capacitor 325 and resistor 327 are used to determine the turning on and turning off time of the transmitting gate circuit 303. The capacitor 325 and resistor 327 are coupled in series to a node C, on which the node C can be regarded as a detection signal of ESD. The first inversing logic circuit 311, which is coupled to the delay circuit 309, the transmitting gate circuit 303 and the N MOSFET 305, is used for generating a first control signal according to the output of the delay circuit 309 (that is, the detection signal). The second inversing logic circuit 313, which is coupled to the first inversing logic circuit 311, the P MOSFET 307 and the transmitting gate circuit 303, is used for generating a second control signal $CS_2$ according to the output of the first inversing logic circuit 311, wherein the transmitting gate circuit 303 turns on or turns off according to the first control signal $CS_1$ and the second control signal $CS_2$.

The transmitting gate circuit 303 is a transmitting gate comprising an N MOSFET 329 and a P MOSFET 331, but this is not meant to limit the scope of the present invention. As shown in FIG. 3, the gate of the N MOSFET 329 (which can also be regarded as a first controlled terminal) is coupled to the gate of the N MOSFET 305, and the source and drain of the N MOSFET 305 are respectively coupled to a second voltage level $V_{GND}$ and the P-Well or body of the N MOSFET 329. The P MOSFET 331 is parallel to the N MOSFET 329, and has a gate (which can be regarded as a second controlled terminal) coupled to the gate of the P MOSFET 307, wherein the source and drain of the P MOSFET 307 are respectively coupled to the first voltage level Vcc and the N-Well of the P MOSFET 331. The first inverting logic circuit 311 and the second inverting logic circuit 313 are inverters in this embodiment, but other logic circuits can reach the same function.

The operations of the ESD protection circuit 300 in a normal operation mode, PS mode, NS mode, and PD mode are respectively described as below. In a normal operation mode (no ESD pulse occurs), the first control signal $CS_1$ from the output terminal A of the first inverting logic circuit 311 has a high level, and the second control signal $CS_2$ from the output terminal B of the second inverting logic circuit 313 has a low level. Therefore, the N MOSFET 305, P MOSFET 307, N MOSFET 329 and P MOSFET 331 are conductive (turned-on) and have a lower input resistance.

If the circuit is in a PS mode when an ESD pulse enters, the terminal C of the first inverting logic circuit 311 is at a high level due to the capacitor 325 coupled to the ESD pulse, thus the voltage at the output terminal A is low and the voltage at the output terminal B is high. The N MOSFET 305, P MOSFET 307, N MOSFET 329 and P MOSFET 331 are non-conductive (turned-off), such that the ESD pulse does not enter the internal circuit 323. In this embodiment, the ESD pulse is conducted out via the rectifying element 319, but can also be conducted out via other outside supporting circuits. Since the outside supporting circuits are well known by persons skilled in the art, they are omitted for brevity. Also, in NS mode, the rectifying element 319 is turned on to conduct out the ESD pulse. Additionally, in PD mode, the rectifying element 317 is turned on to conduct out the ESD pulse.

The rectifying element 319 is turned on in the ND mode, such that the second voltage level is adjusted to a voltage level similar to that of the ESD pulse. Since the ESD pulse is a negative voltage, the first voltage level is comparatively high. The terminal C of the first inverting logic circuit 311 is coupled to a relatively high voltage level, thus the first control signal $CS_1$ from the output terminal A has a low level, and the second control signal $CS_2$ from the output terminal B of the second inverting logic circuit 313 has a high level.

The N MOSFET 305, P MOSFET 307, N MOSFET 329 and P MOSFET 331 are non-conductive (turned-off), such that the ESD pulse does not enter the internal circuit 323. In this embodiment, the ESD pulse is conducted out via the rectifying element 317, but can also be conducted out via other outside supporting circuits. Since the outside supporting circuits are well known by persons skilled in the art, they are omitted for brevity.

According to the above-mentioned circuit, since the P MOSFET 331 is not directly coupled to the delay circuit 309, the transmitting gate circuit can be prevented from turning off incompletely. Therefore, the P MOSFET 307 can prevent the generation of a parasitic channel (for example, NPN parasitic channel). Besides, the circuit utilizes no LC oscillating circuit, such that a potential oscillating problem can be avoided, and the area of the circuit can be adjusted via adjusting the gate width of the transmitting gate circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ESD protection circuit, comprising:
   an ESD protection element, coupled to a pad;
   a transmitting gate circuit, coupled to the pad and an output terminal;

a first N MOSFET, coupled to the transmitting gate circuit and a second voltage level, for providing a first biasing voltage to the transmitting gate circuit according to the second voltage level;

a first P MOSFET, coupled to the transmitting gate circuit and a first voltage level, for providing a second biasing voltage to the transmitting gate circuit according to the first voltage level;

a delay circuit, coupled to the ESD protection element, for determining a turning on and turning off time of the transmitting gate circuit, wherein the delay circuit is not directly connected to the transmitting gate circuit;

a first inversing logic circuit, coupled to the delay circuit, the transmitting gate circuit and the N MOSFET, for generating a first control signal according to the output of the delay circuit; and a second inversing logic circuit, coupled to the first inversing logic circuit, the P MOSFET and the transmitting gate circuit, for generating a second control signal according to the output of the first inversing logic circuit, wherein the transmitting gate circuit turns on or turns off according to the first control signal and the second control signal.

2. The ESD protection circuit of claim 1, wherein the transmitting gate circuit comprises:

a second N MOSFET, having a gate coupled to the gate of the first N MOSFET, wherein the first N MOSFET has a source coupled to the second voltage level and a drain coupled to the P-Well or body of the second N MOSFET; and a second P MOSFET, parallel to the second N MOSFET and having a gate coupled to the gate of the first P MOSFET, wherein the first P MOSFET has a source coupled to the first voltage level and a drain coupled to the N-Well of the second P MOSFET.

3. The ESD protection circuit of claim 1, wherein the ESD protection element comprises:

a first rectifying element, coupled to the delay circuit, the transmitting gate circuit and the pad; and a second rectifying element, coupled to the first rectifying element and the second voltage level.

4. The ESD protection circuit of claim 3, wherein the first rectifying element or the second rectifying element are diodes or MOSFETs.

5. The ESD protection circuit of claim 1, wherein the delay circuit comprises:

a capacitor, coupled to the first voltage level and the ESD element; and a resistor, coupled to the first inversing logic circuit and the capacitor.

6. The ESD protection circuit of claim 1, wherein the first inversing logic circuit or the second inversing logic circuit are invertors.

7. An ESD protection circuit for protecting an internal circuit, comprising:

a transmitting gate circuit, coupled to a pad and the internal circuit, having a first controlled terminal and a second controlled terminal, for controlling the pad and the internal circuit to have a conductive path or not according to signals of the first controlled terminal and the second controlled terminal;

a delay circuit, for detecting if an ESD event occurs, and for providing a detection signal according to the detection result;

a first logic circuit, coupled to the delay circuit and the first controlled terminal, for providing a first control signal to the first controlled terminal according to the detection signal of the detection circuit; and a second logic circuit, for providing a second control signal to the second controlled terminal according to the detection signal;

wherein the delay circuit is not directly coupled to the transmitting gate circuit.

8. The ESD protection circuit of claim 7, wherein the second logic circuit is coupled between the first logic circuit and the second controlled terminal, for providing the second control signal to the second controlled terminal according to the first control signal.

9. The ESD protection circuit of claim 7, wherein the transmitting gate circuit further comprises a first biasing terminal and a second biasing terminal, where the ESD protection circuit comprises:

a first semiconductor unit, coupled between the first biasing terminal and a second power line, wherein the first semiconductor unit controls the first biasing terminal and the second power line to have a conductive path or not according to the first control signal; and a second semiconductor unit, coupled between the second biasing terminal and a first power line, wherein the second semiconductor unit controls the second biasing terminal and the first power line to have a conductive path or not according to the second control signal.

10. The ESD protection circuit of claim 7, wherein the transmitting gate circuit comprises two MOSFETs, where the first and second biasing terminals are coupled to the bodies of the two MOSFETs respectively.

* * * * *